(12) United States Patent
Wu et al.

(10) Patent No.: US 10,818,752 B2
(45) Date of Patent: Oct. 27, 2020

(54) SEMICONDUCTOR DEVICE WITH CAP ELEMENT

(71) Applicant: TAIWAN SEMICONDUCTOR MANUFACTURING CO., LTD., Hsinchu (TW)

(72) Inventors: Shing-Huang Wu, Hsin-Chu (TW); Jian-Shian Chen, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 11 days.

(21) Appl. No.: 16/229,213

(22) Filed: Dec. 21, 2018

(65) Prior Publication Data
US 2019/0115429 A1 Apr. 18, 2019

Related U.S. Application Data

(60) Continuation of application No. 15/249,609, filed on Aug. 29, 2016, now Pat. No. 10,164,013, which is a
(Continued)

(51) Int. Cl.
H01L 21/336 (2006.01)
H01L 29/08 (2006.01)
H01L 29/78 (2006.01)
H01L 21/02 (2006.01)
H01L 29/66 (2006.01)
(Continued)

(52) U.S. Cl.
CPC ...... H01L 29/0847 (2013.01); H01L 21/0262 (2013.01); H01L 21/02636 (2013.01); H01L 21/3065 (2013.01); H01L 29/66628 (2013.01); H01L 29/66636 (2013.01); H01L 29/7848 (2013.01); H01L 21/02532 (2013.01); H01L 29/045 (2013.01); H01L 29/165 (2013.01);
(Continued)

(58) Field of Classification Search
CPC ............ H01L 29/0847; H01L 21/0262; H01L 21/02636; H01L 21/3065; H01L 29/66628; H01L 29/66636; H01L 29/7848
See application file for complete search history.

(56) References Cited

U.S. PATENT DOCUMENTS 6,358,316 B1  3/2002 Kizuki et al.
6,483,171 B1  11/2002 Forbes et al.
(Continued)

FOREIGN PATENT DOCUMENTS

KR  10-2015-0009446 A  1/2015
KR  10-2016-0117117 A  10/2016

Primary Examiner — Victor A Mandala
Assistant Examiner — Colleen E Snow
(74) Attorney, Agent, or Firm — Birch, Stewart, Kolasch & Birch, LLP

(57) ABSTRACT

A semiconductor device structure is provided. The semiconductor device structure includes a gate stack over a semiconductor substrate and a source/drain structure adjacent to the gate stack. The semiconductor device structure also includes a cap element over the source/drain structure. The cap element has a first top plane and the source/drain structure has a second top plane. The first top plane of the cap element is wider than the second top plane of the source/drain structure. A surface orientation of the first top plane of the cap element and a surface orientation of a side surface of the cap element are different from each other.

20 Claims, 7 Drawing Sheets

Related U.S. Application Data division of application No. 14/658,688, filed on Mar. 16, 2015, now Pat. No. 9,431,536.

(51) Int. Cl.
    *H01L 21/3065*     (2006.01)
    *H01L 29/165*     (2006.01)
    *H01L 29/04*     (2006.01)

(52) U.S. Cl.
    CPC ...... *H01L 29/665* (2013.01); *H01L 29/66545* (2013.01)

(56) References Cited

U.S. PATENT DOCUMENTS

| | | |
|---|---|---|
| 6,570,217 B1 | 5/2003 | Sato et al. |
| 7,989,296 B2 | 8/2011 | Lee et al. |
| 8,647,653 B2 | 2/2014 | Liao et al. |
| 2006/0138398 A1 | 6/2006 | Shimamune et al. |
| 2008/0157091 A1 | 7/2008 | Shin et al. |
| 2009/0095992 A1* | 4/2009 | Sanuki .............. H01L 29/66636 257/288 |
| 2009/0162995 A1 | 6/2009 | Ohmi et al. |
| 2012/0181625 A1 | 7/2012 | Kwok et al. |
| 2013/0252392 A1 | 9/2013 | Cheng et al. |
| 2015/0021688 A1 | 1/2015 | Sung et al. |
| 2016/0293702 A1 | 10/2016 | Chen et al. |

* cited by examiner

SEMICONDUCTOR DEVICE WITH CAP ELEMENT

CROSS REFERENCE

This Application is a Continuation application of U.S. patent application Ser. Ser. No. 15/249,609, filed on Aug. 29, 2016, which is a Divisional of U.S. application Ser. No. 14/658,688, filed on Mar. 16, 2015, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs.

However, since the feature sizes continue to decrease, fabrication processes continue to become more difficult to perform. Therefore, it is a challenge to form reliable semiconductor devices with smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
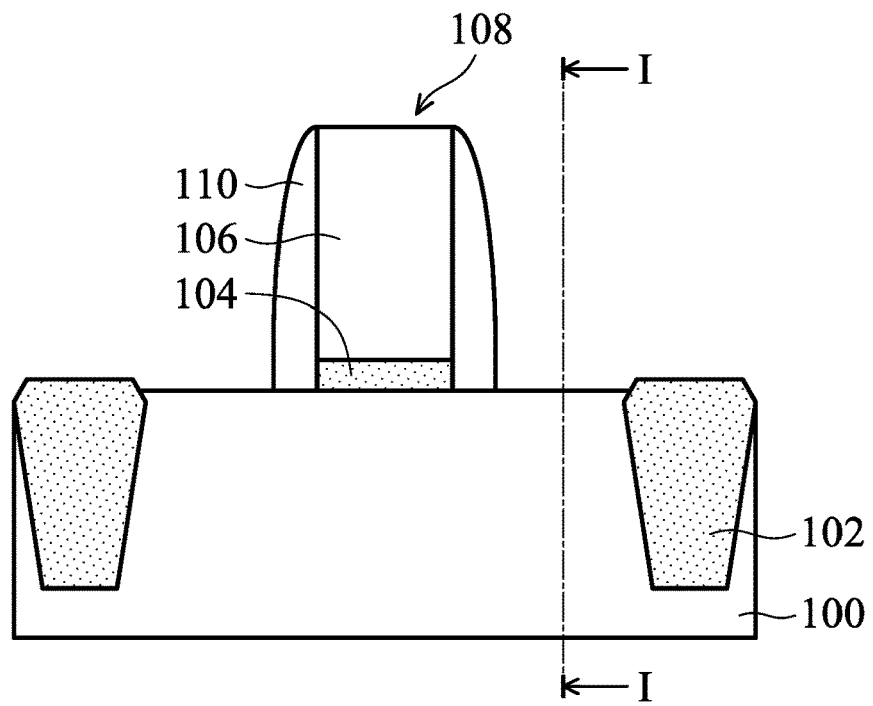
FIGS. 1A-1E are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1E are cross-sectional views of various stages of a process for forming a semiconductor device structure, in accordance with some embodiments. FIGS. 2A-2E are cross-sectional views of various stages of a process for forming a semiconductor device structure, in accordance with some embodiments. In some embodiments, FIGS. 2A-2E are cross-sectional views of a process for forming a semiconductor device structure, that are taken along line I-I shown in FIG. 1A. Additional operations can be provided before, during, and/or after the stages described in FIGS. 1A-1E and/or FIGS. 2A-2E. Some of the stages that are described can be replaced or eliminated for different embodiments. Additional features can be added in the semiconductor device structure. Some of the features described below can be replaced or eliminated for different embodiments.

Figure 2A:
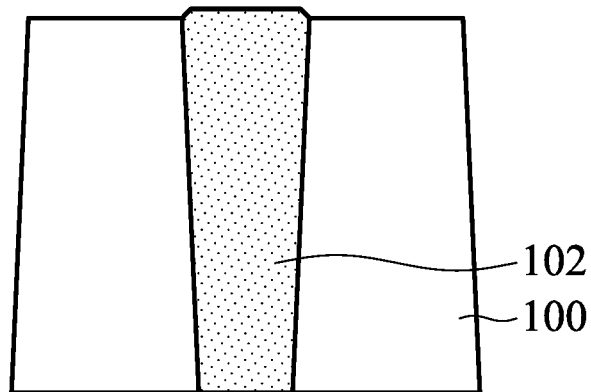
FIGS. 2A-2E are cross-sectional views of various stages of a process for forming a semiconductor device structure, in accordance with some embodiments.

As shown in FIGS. 1A and 2A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or other elementary semiconductor materials such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof. In some embodiments, the semiconductor substrate 100 includes a fin structure.

As shown in FIGS. 1A and 2A, isolation features 102 are formed in the semiconductor substrate 100, in accordance with some embodiments. The isolation features 102 are used to define and/or electrically isolate various device elements formed in and/or over the semiconductor substrate 100. In some embodiments, the isolation features 102 includes shallow trench isolation (STI) features, local oxidation of silicon (LOCOS) features, another suitable isolation feature, or a combination thereof. In some embodiments, the isolation features 102 are made of a dielectric material. The dielectric material may include silicon oxide, silicon nitride, silicon oxynitride, fluoride-doped silicate glass (FSG), low-K dielectric material, another suitable material, or a combination thereof.

As shown in FIG. 1A, gate stacks including a gate stack 108 are formed over the semiconductor substrate 100, in accordance with some embodiments. In some embodiments, the gate stack 108 includes a gate dielectric layer 104 and a gate electrode 106. In some embodiments, the gate stack 108 further includes a hard mask (not shown) on the gate electrode 106. The hard mask may serve as an etching mask during the formation of the gate electrode 106. In some embodiments, the gate stack 108 is a portion of a SRAM device.

In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will be removed in a subsequent gate replacement process. The dummy gate dielectric layer is, for example, a silicon oxide layer.

In some embodiments, the gate electrode 106 includes polysilicon, a metal material, another suitable conductive material, or a combination thereof. In some embodiments, the gate electrode 106 is a dummy gate electrode and will be replaced with another conductive material, such as a metal material. The dummy gate electrode layer is made of, for example, polysilicon.

In some embodiments, a gate dielectric material layer, a gate electrode layer, and a hard mask layer are deposited over the semiconductor substrate 100. Each of the gate dielectric material layer, the gate electrode layer, and the hard mask layer may be deposited using a chemical vapor deposition (CVD) process, an atomic layer deposition (ALD) process, a physical vapor deposition (PVD) process, another applicable process, or a combination thereof. Afterwards, a photolithography process and an etching process are performed to pattern the hard mask layer so as to form the hard mask. The gate dielectric material layer and the gate electrode layer are etched afterwards through openings defined by the hard mask. As a result, multiple gate stacks including the gate stack 108 are formed.

In some embodiments, spacer elements 110 are formed over sidewalls of the gate stack 108, as shown in FIG. 1A. The spacer elements 110 may be made of silicon nitride, silicon oxynitride, silicon carbide, silicon carbon nitride, another suitable material, or a combination thereof. In some embodiments, a spacer material layer is deposited over the semiconductor substrate 100 and the gate stack 108. Afterwards, an anisotropic etching process is performed to partially remove the spacer material layer. As a result, the remaining portions of the spacer material layer form the spacer elements 110.

Figure 1B:
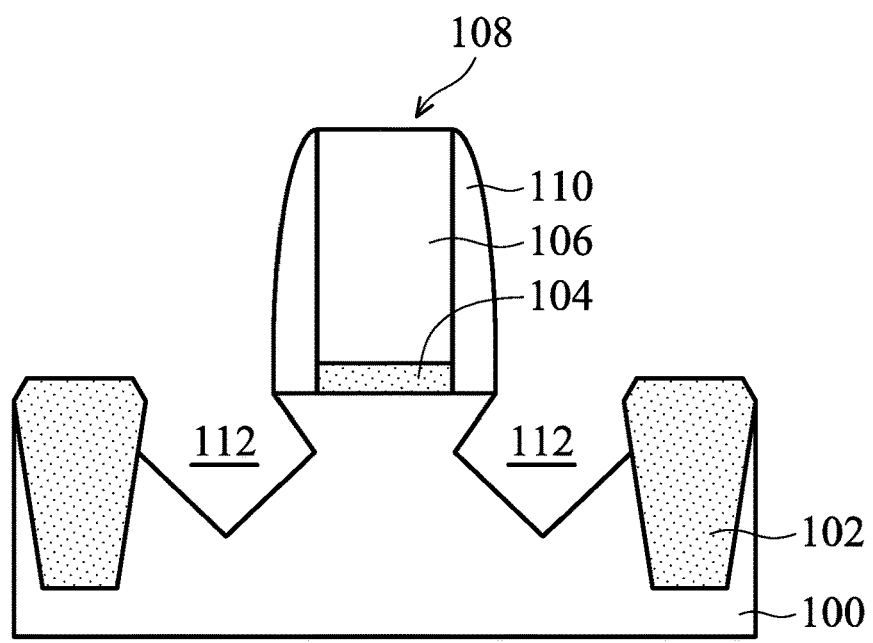
Figure 2B:
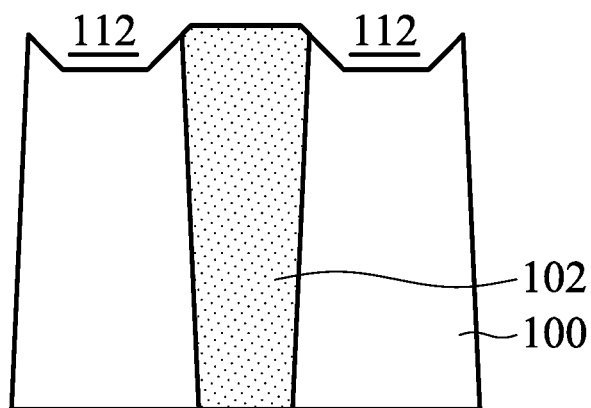

As shown in FIGS. 1B and 2B, recesses 112 are formed in the semiconductor substrate 100, in accordance with some embodiments. The recesses 112 are used to contain source/drain structures that will be formed subsequently. In some embodiments, the recesses 112 are in the semiconductor substrate 100 and adjacent to the gate stacks. In some embodiments, each of the recesses 112 extends laterally under a corresponding channel region of the corresponding gate stack (such as the gate stack 108), as shown in FIG. 1B.

In some embodiments, one or more etching operations are used to form the recesses 112. The gate stack 108 and the spacer elements 110 may serve as an etching mask during the formation of the recesses 112. In some embodiments, the formation of the recesses 112 includes performing an anisotropic etching to etch into the semiconductor substrate 100. Afterwards, a wet etching is performed by dipping the semiconductor substrate 100 into an etching solution. As a result, the recesses 112 are formed.

Figure 1C:
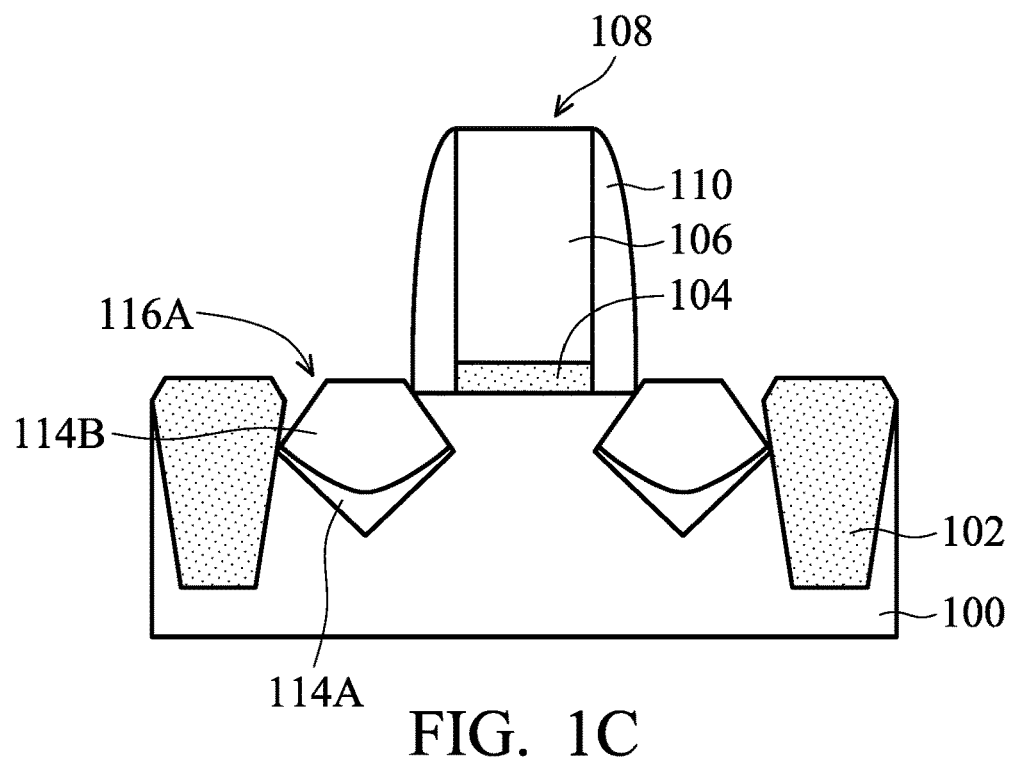
Figure 2C:
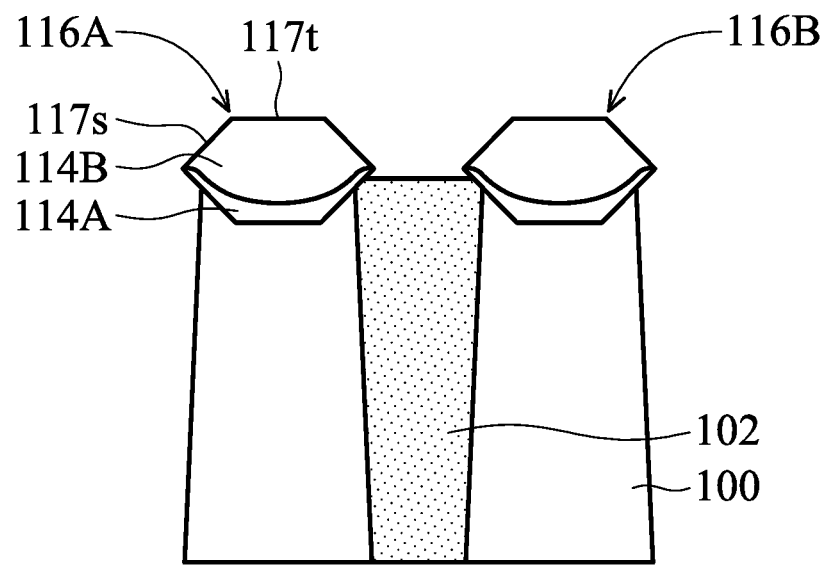

As shown in FIGS. 1C and 2C, source/drain structures including the source/drain structures 116A and 116B are formed in the recesses 112, in accordance with some embodiments. In some embodiments, the source/drain structure 116B is the source/drain region of another transistor other than that shown in FIG. 1C. The source/drain structures 116A and 116B may be used as stressors for providing stress or strain to the channel regions so as to increase the carrier mobility.

In some embodiments, the source/drain structures 116A and 116B are p-type regions. For example, the source/drain structures 116A and 116B may include epitaxially grown silicon germanium. In some embodiments, the source/drain structures 116A and 116B are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. In some embodiments, the source/drain structures 116A and 116B are doped with one or more suitable dopants. For example, the source/drain structures 116A and 116B are SiGe source/drain features doped with boron (B) or another suitable dopant.

In some embodiments, the source/drain structures 116A and 116B are doped in-situ during their epitaxial growth. In some other embodiments, the source/drain structures 116A and 116B are not doped during the growth of the source/drain structures 116A and 116B. Instead, after the formation of the source/drain structures 116A and 116B, the source/drain structures 116A and 116B are doped in a subsequent process. In some embodiments, the doping is achieved by using an ion implantation process, a plasma immersion ion implantation process, a gas and/or solid source diffusion process, another applicable process, or a combination thereof. In some embodiments, the source/drain structures 116A and 116B are further exposed to one or more annealing processes to activate the dopants. For example, a rapid thermal annealing process is used.

In some embodiments, each of the source/drain structures 116A and 116B includes a lower portion 114A and an upper portion 114B, as shown in FIGS. 1C and 2C. In some embodiments, the compositions of the lower portion 114A and the upper portion 114B are different from each other. In some embodiments, both the lower portion 114A and the upper portion 114B include silicon germanium. However, the compositions of the lower portion 114A and the upper portion 114B are not completely the same. In some embodiments, the atomic concentration of germanium in the upper portion 114B is greater than the atomic concentration of germanium in the lower portion 114A.

Figure 3:
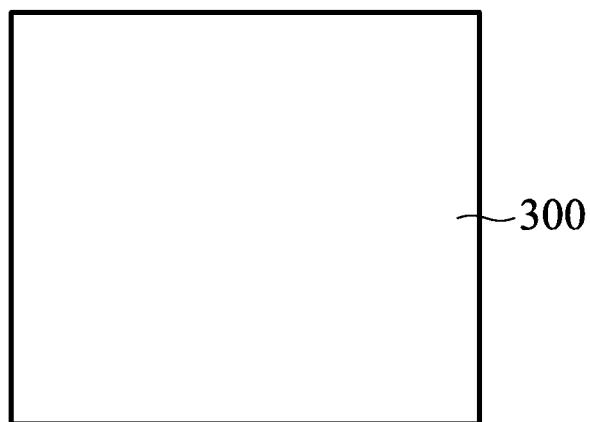
FIG. 3 is a cross-sectional view of a process chamber used for forming a semiconductor device structure, in accordance with some embodiments.

FIG. 3 is a cross-sectional view of a process chamber used for forming a semiconductor device structure, in accordance with some embodiments. In some embodiments, the lower portion 114A and the upper portion 114B are epitaxially grown in-situ in the same process chamber 300. In some embodiments, the source/drain structures 116A and 116B are formed using a gas mixture. In some embodiments, a silicon-containing gas and a germanium-containing gas are used to form the source/drain structures 116A and 116B. In some embodiments, the silicon-containing gas includes dichlorosilane (DCS), silane ($SiH_4$), methylsilane ($SiCH_6$), another suitable gas, or a combination thereof. In some embodiments, the germanium-containing gas includes germane ($GeH_4$) or another suitable gas. In some embodiments, a gas mixture including germane and DCS is used for growing the lower portion 114A. Afterwards, the gas flow of germane is increased so as to continue growing the upper portion 114B.

Figure 1D:
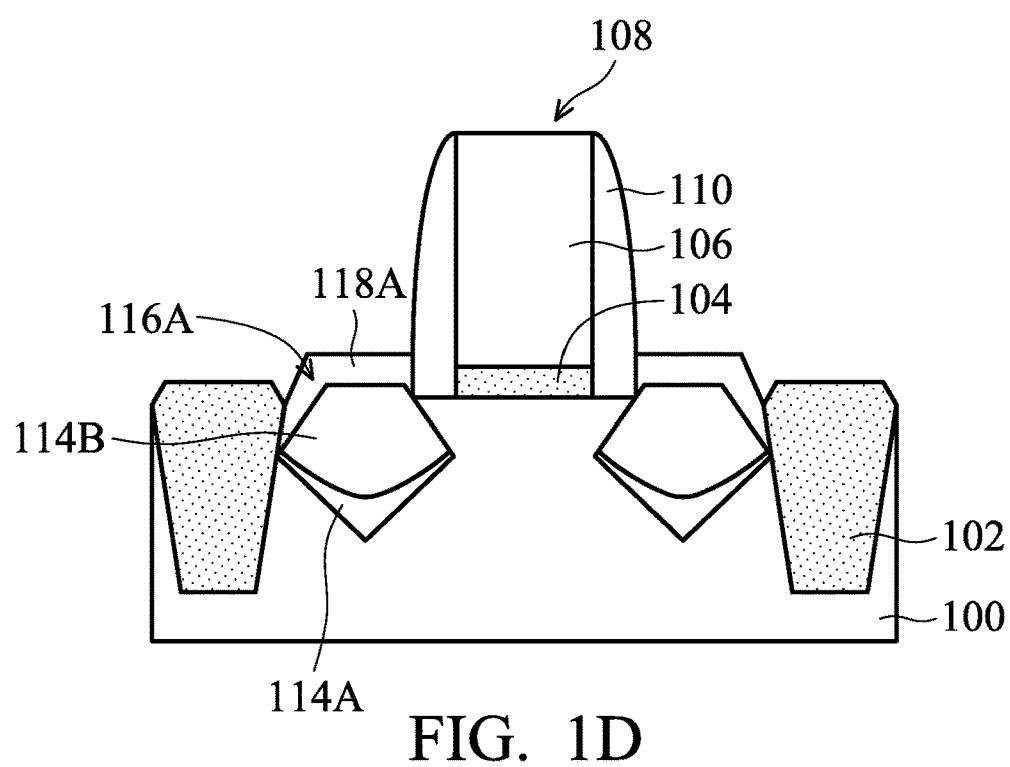
Figure 2D:
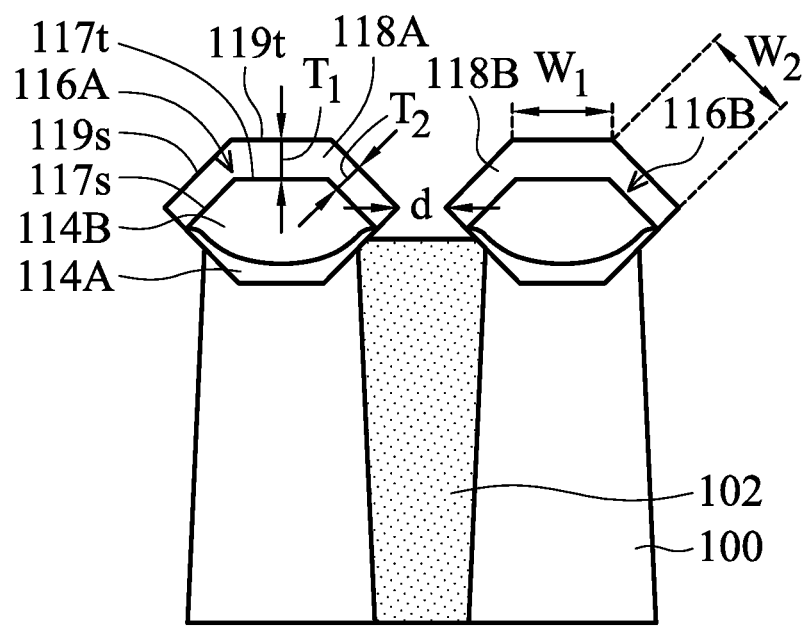

As shown in FIGS. 1D and 2D, cap elements including cap elements 118A and 118B are respectively formed over the source/drain structures 116A and 116B, in accordance with some embodiments. The cap elements 118A and 118B may be used to protect the source/drain structures thereunder. The cap elements 118A and 118B may also be used for forming metal silicide features to enhance electrical connection between the source/drain structures and other conductive elements. In some embodiments, the source/drain structures 116A and 116B are in direct contact with the cap elements 118A and 118B, respectively.

In some embodiments, the cap elements 118A and 118B include silicon, silicon germanium, or a combination thereof. In some embodiments, the atomic concentration of germanium in the lower portion 114A is greater than the atomic concentration of germanium in the cap element 118A or 118B. In some embodiments, the cap elements 118A and 118B contain substantially no germanium.

In some embodiments, the cap elements 118A and 118B are formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof. In some embodiments, the cap elements 118A and 118B are formed in-situ in the same process chamber 300 where the source/drain structures 116A and 116B are grown.

In some embodiments, the process conditions for forming the cap elements 118A and 118B are fine-tuned to ensure the cap elements 118A and 118B have the desired profiles. As shown in FIG. 2D, the cap elements 118A and 118B are separated from each other by a distance d. In some embodiments, the distance d is the shortest distance between the cap elements 118A and 118B. In some embodiments, the distance d is greater than about 24 nm to ensure that no short-circuit is formed between the cap elements 118A and 118B and the source/drain structures 116A and 116B thereunder.

In some embodiments, the gas mixture used for forming the cap elements 118A and 118B includes a deposition gas and an etching gas. In some embodiments, the deposition gas includes a germanium-containing gas and a silicon-containing gas. In some embodiments, the germanium-containing gas includes germane ($GeH_4$). In some embodiments, the silicon-containing gas includes dichlorosilane (DCS), silane ($SiH_4$), methylsilane ($SiCH_6$), another suitable gas, or a combination thereof. For example, the deposition gas includes germane ($GeH_4$) and dichlorosilane (DCS). In some other embodiments, the germanium-containing gas is not used. In these cases, the cap elements 118A and 118B includes substantially no germanium. In some embodiments, the etching gas includes a halogen-containing gas. In some embodiments, the etching gas includes HCl, HF, $Cl_2$, another suitable etching gas, or a combination thereof.

In some embodiments, the amount of the etching gas is fine-tuned to ensure the cap elements 118A and 118B have the desired profiles. In some embodiments, a volumetric concentration ratio of the etching gas to the deposition gas is set to be in a range from about 0.6 to about 1. In some embodiments, a flow rate ratio of the etching gas to the deposition gas is set to be in a range from about 0.6 to about 1. In some embodiments, the gas mixture used for forming the cap elements 118A and 118B includes HCl gas and DCS gas. The volumetric concentration ratio (or flow rate ratio) of HCl gas to DCS gas may be in a range from about 0.6 to about 1.

In some cases, if the volumetric concentration ratio (or flow rate ratio) of the etching gas to the deposition gas is greater than about 1, the etching rate may be too fast such that the cap elements 118A and 118B might not have sufficient thicknesses. As a result, the cap elements 118A and 118B might not be able to protect the source/drain structures 116A and 116B thereunder during subsequent processes. In some other cases, if the volumetric concentration ratio (or flow rate ratio) of the etching gas to the deposition gas is smaller than about 0.6, the etching rate might be too slow. As a result, the cap elements 118A and 118B might grow too fast to be wider than what is desired. The distance d between the cap elements 118A and 118B may thus be too small. A short-circuit might be formed between the cap elements 118A and 118B and the source/drain structures 116A and 116B thereunder.

As shown in FIG. 2D, each of the cap elements 118A and 118B has a top surface (or top plane) 119t. In some embodiments, the top surface 119t is substantially parallel to a top surface 117t of the source/drain structure 116A or 116B. As shown in FIG. 2D, each of the cap elements 118A and 118B has a side surface (or side plane) 119s. In some embodiments, the top surface 119s is substantially parallel to a side surface 117s of the source/drain structure 116A or 116B. In some embodiments, the surface orientation of the top surface 119t is {311}. In some embodiments, the surface orientation of the side surface of the cap element is {111}. By increasing the amount of etching gas in the gas mixture for forming the cap elements 118A and 118B, the growth of the crystal plane {111} may be retarded. Therefore, a larger top surface having the surface orientation of {311} is formed, in accordance with some embodiments. A larger contact landing area is provided. Even if the larger contact landing area is obtained, the active area between the isolation features 102 is not reduced. The performance of the semiconductor device structure is improved.

As shown in FIG. 2D, the top surface 119t and the side surface 119s have widths $W_1$ and $W_2$, respectively. As mentioned above, the growth of the crystal plane {111} may be retarded by increasing the amount of etching gas. The width $W_1$ that is wide is therefore obtained. In some embodiments, the width ratio ($W_1/W_2$) of the top surface 119t to the side surface 119s is in a range from about 0.125 to about 1.

In some cases, if the width ratio ($W_1/W_2$) is smaller than about 0.125, the width $W_1$ might be too small. As a result, the contact landing window is not sufficient, which may lead to a degradation of performance. In some other cases where the width ratio ($W_1/W_2$) is greater than about 1, the thickness of the cap elements 118A or 118B may not be sufficient even if the width $W_1$ is large. In some cases, two adjacent cap elements may come in contact with each other, which may cause a short-circuit issue.

In some embodiments, a ratio ($d/W_1$) of the shortest distance d between the cap elements 118A and 118B to the width $W_1$ of the top surface 119t of the cap element 118A or 118B is in a range from about 0.6 to about 0.8. In some cases, if the ratio ($d/W_1$) is smaller than about 0.6, the distance d might be too small. A short-circuit between the cap elements 118A and 118B may be formed. In some other cases, if the ratio (d/$W_1$) is greater than about 0.8, the width $W_1$ may be too small. The contact landing area may not be sufficient.

As shown in FIG. 2D, each of the cap elements 118A and 118B has a first thickness $T_1$ and a second thickness $T_2$. The thickness $T_1$ is substantially equal to a distance between the top surfaces 119t and 117t, as shown in FIG. 2D. The thickness $T_2$ is substantially equal to a distance between the top surfaces 119s and 117s, as shown in FIG. 2D. In some embodiments, a ratio ($T_1/T_2$) of the first thickness $T_1$ to the second thickness $T_2$ is in a range from about 0.8 to about 1.2. In some embodiments, the thickness $T_1$ and $T_2$ are substantially the same.

In some cases, if the ratio ($T_1/T_2$) is smaller than about 0.8, the thickness $T_1$ might be too small. The cap elements 118A and 118B may be too thin. The thin cap elements 118A and 118b may not be able to protect the source/drain structures from being damaged during subsequent processes, such as a salicidation process and/or a contact formation process. The thickness $T_2$ may be too large such that a short-circuit may be formed between the cap elements 118A and 118B. In some other cases, if the ratio ($T_1/T_2$) is greater than about 1.2, the thickness $T_1$ might be too large, which is also negatively affect subsequent processes.

Figure 1E:
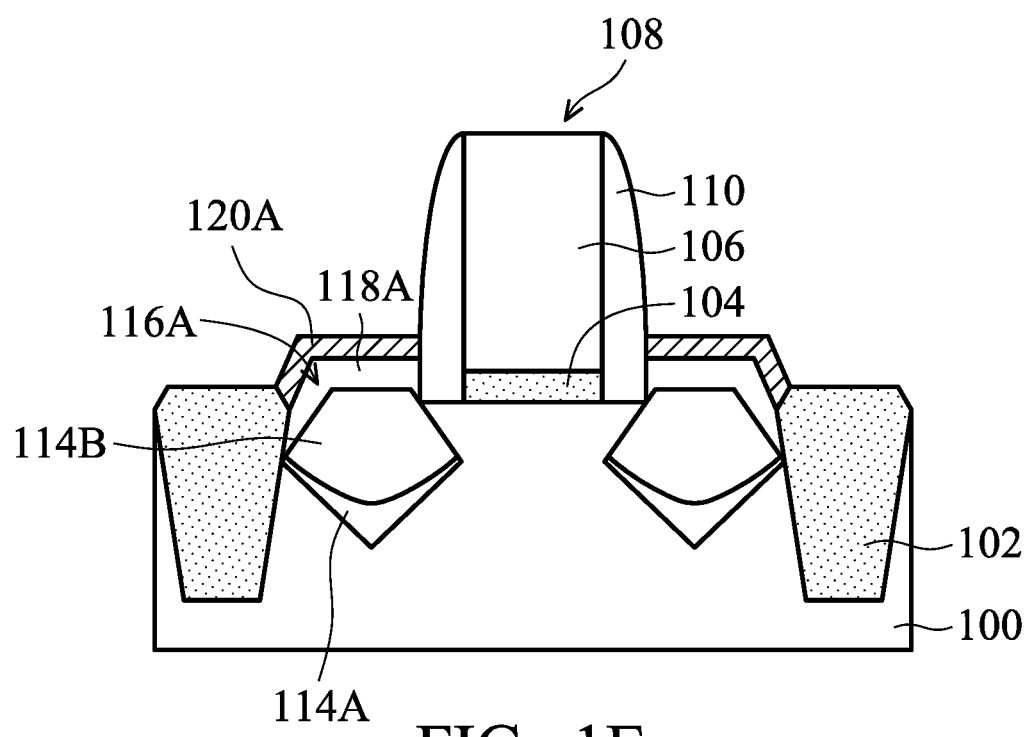
Figure 2E:
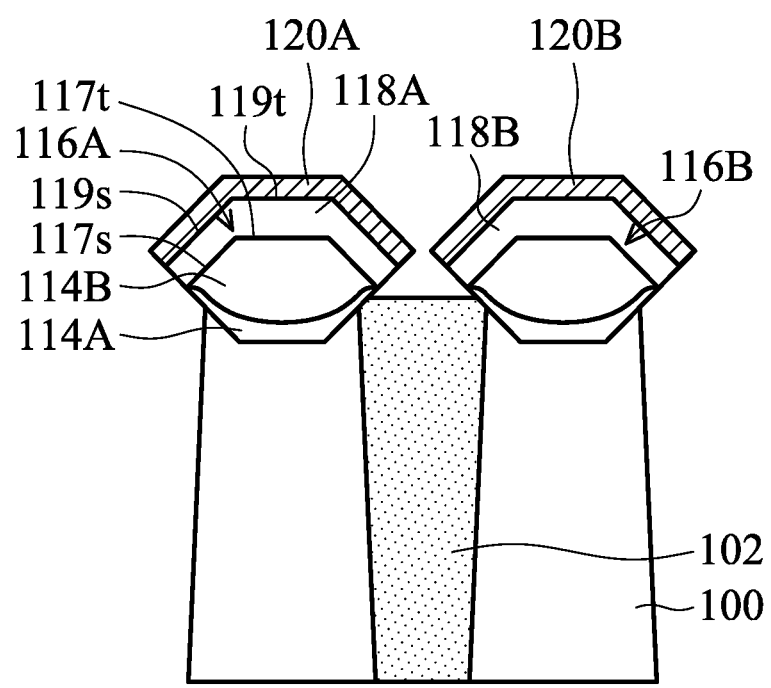

Afterwards, a salicidation (self-aligned silicidation) process is performed on the cap elements 118A and 118B to form metal silicide features 120A and 120B, as shown in FIGS. 1E and 2E in accordance with some embodiments. In some embodiments, upper portions of the cap elements 118A and 118B are turned into the metal silicide features after the salicidation process. In some other embodiments, the cap elements 118A and 118B are completely turned into the metal silicide features. In these cases, the metal silicide features serve as the cap elements on the source/drain structures 116A and 116B. In some other embodiments, each of the cap element includes an upper portion made of metal silicide and a lower portion made of silicon or silicon germanium.

In some embodiments, a metal film is deposited on the structures shown in FIG. 1D or 2D. The metal film is in direct contact with the cap elements 118A and 118B. The metal film may be deposited using a CVD process, a PVD process, an electroplating process, an electroless plating process, another applicable process, or a combination thereof. A thermal operation is then carried out to initial a reaction between the deposited metal film and the exposed surface of the cap elements 118A and 118B. As a result, the metal silicide features 120A and 120B are formed. The un-reacted portion of the deposited metal film is then removed, for example, by using an etching process. The metal silicide features 120A and 120B have lower resistance than non-silicided regions, especially in smaller geometries.

The material of the deposited metal film may include nickel. Therefore, a nickel silicide region including $Ni_2Si$, $NiSi_2$, $NiSi$, and/or combinations thereof may be formed. Other suitable metal materials may also be used to form the metal silicide regions, such as cobalt (Co), nickel (Ni), platinum (Pt), titanium (Ti), ytterbium (Yb), molybdenum (Mo), erbium (Er), and/or combinations thereof.

Afterwards, a gate replacement process is performed to replace the gate stacks including the gate stack 108 with metal gate stacks, in accordance with some embodiments. In some embodiments, a dielectric layer is deposited over the structure shown in FIG. 1E or 2E. The dielectric layer is used as an interlayer dielectric layer. A planarization process is performed on the dielectric layer to thin the dielectric layer until the gate electrode 106 is exposed, in accordance with some embodiments. The planarization process may include a chemical mechanical polishing (CMP) process, a grinding process, an etching process, another applicable process, or a combination thereof.

In some embodiments, the gate electrode 106 and the gate dielectric layer 104 are removed to form recesses. One or more etching processes may be used to form the recesses. Afterwards, metal gate stacks are formed in the recesses, in accordance with some embodiments. In some embodiments, each of the metal gate stacks includes a gate dielectric layer, a work function layer, and a gate electrode layer.

Embodiments of the disclosure form cap elements over source/drain structures. The process condition is fine-tuned to ensure the cap elements have the desired profiles. For example, more etching gas is used to control the growth of the cap elements. Each of the cap elements has a wide top surface to provide a larger contact landing area. The lateral distance between two adjacent cap elements is increased. Therefore, short-circuit is prevented from occurring between the cap elements and the source/drain structures thereunder. Performance and reliability of the semiconductor device structure are improved.

In accordance with some embodiments, a semiconductor device structure is provided. The semiconductor device structure includes a gate stack over a semiconductor substrate and a source/drain structure adjacent to the gate stack. The semiconductor device structure also includes a cap element over the source/drain structure. The cap element has a top surface and a side surface substantially parallel to the side surface of the source/drain structure. A width ratio of the top surface to the side surface of the cap element is in a range from about 0.125 to about 1.

In accordance with some embodiments, a semiconductor device structure is provided. The semiconductor device structure includes a gate stack over a semiconductor substrate and a source/drain structure adjacent to the gate stack. The semiconductor device structure also includes a cap element over the source/drain structure. The cap element cap element has a first thickness substantially equal to a distance between a top surface of the cap element and a top surface of the source/drain structure. The cap element has a second thickness substantially equal to a distance between a side surface of the cap element and a side surface of the source/drain structure. A ratio of the first thickness to the second thickness is in a range from about 0.8 to about 1.2.

In accordance with some embodiments, a method for forming a semiconductor device structure is provided. The method includes forming a gate stack over a semiconductor substrate and forming a source/drain structure adjacent to the gate stack. The method also includes forming a cap element over the source/drain structure. The cap element has a top surface and a side surface. A width ratio of the top surface to the side surface of the cap element is in a range from about 0.125 to about 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a gate stack over a semiconductor substrate;
a source/drain structure adjacent to the gate stack;
a cap element over the source/drain structure, wherein:
the cap element has a first top plane,
the source/drain structure has a second top plane,
the first top plane of the cap element is wider than the second top plane of the source/drain structure, and
a surface orientation of the first top plane of the cap element and a surface orientation of a side surface of the cap element are different from each other, and the surface orientation of the side surface of the cap element is {111}.

2. The semiconductor device structure as claimed in claim 1, wherein the surface orientation of the first top plane of the cap element is {311}.

3. The semiconductor device structure as claimed in claim 1, wherein an atomic concentration of germanium in the source/drain structure is greater than an atomic concentration of germanium in the cap element.

4. The semiconductor device structure as claimed in claim 1, wherein the cap element is in direct contact with the source/drain structure.

5. The semiconductor device structure as claimed in claim 1, wherein the cap element comprises silicon, silicon germanium, or a combination thereof.

6. The semiconductor device structure as claimed in claim 1, wherein the source/drain structure comprises a lower portion and an upper portion, the upper portion is between the lower portion and the cap element, and compositions of the lower portion and the upper portion are different.

7. The semiconductor device structure as claimed in claim 6, wherein an atomic concentration of germanium in the upper portion is greater than an atomic concentration of germanium in the lower portion.

8. The semiconductor device structure as claimed in claim 1, further comprising:
a second source/drain structure adjacent to the source/drain structure; and
a second cap element over the second source/drain structure, wherein a ratio of a shortest distance between the cap element and the second cap element to a width of the first top plane of the cap element is in a range from about 0.6 to about 0.8.

9. The semiconductor device structure as claimed in claim 1, wherein the cap element has an upper portion and a lower portion, the lower portion is between the upper portion and the source/drain structure, and the upper portion of the cap element is made of metal silicide.

10. A semiconductor device structure, comprising:
a gate stack over a semiconductor substrate;
a source/drain structure adjacent to the gate stack;
a cap element over the source/drain structure, wherein:
the cap element has a first top plane,
the source/drain structure has a second top plane,
the first top plane of the cap element is wider than the second top plane of the source/drain structure, and
an atomic concentration of germanium in the source/drain structure is greater than an atomic concentration of germanium in the cap element;
a second source/drain structure adjacent to the source/drain structure; and
a second cap element over the second source/drain structure, wherein a ratio of a shortest distance between the cap element and the second cap element to a width of the first top plane of the cap element is in a range from about 0.6 to about 0.8.

11. The semiconductor device structure as claimed in claim 10, wherein a surface orientation of the first top plane of the cap element is {311}, and a surface orientation of the side surface of the cap element is {111}.

12. The semiconductor device structure as claimed in claim 10, wherein the source/drain structure comprises a lower portion and an upper portion, the upper portion is between the lower portion and the cap element, and compositions of the lower portion and the upper portion are different.

13. The semiconductor device structure as claimed in claim 12, wherein an atomic concentration of germanium in the upper portion is greater than an atomic concentration of germanium in the lower portion.

14. A semiconductor device structure, comprising:
a gate stack over a semiconductor substrate;
a first source/drain structure adjacent to the gate stack;
a cap element over the first source/drain structure;
a second source/drain structure adjacent to the first source drain structure; and
a second cap element over the second source/drain structure, wherein a ratio of a shortest distance between the cap element and the second cap element to a width of a top plane of the cap element is in a range from about 0.6 to about 0.8.

15. The semiconductor device structure as claimed in claim 14, wherein a surface orientation of the top plane of the cap element is {311}, and a surface orientation of a side surface of the cap element is {111}.

16. The semiconductor device structure as claimed in claim 14, wherein a surface orientation of the top plane of the cap element and a surface orientation of a side surface of the cap element are different from each other.

17. The semiconductor device structure as claimed in claim 14, wherein an atomic concentration of germanium in the source/drain structure is greater than an atomic concentration of germanium in the cap element.

18. The semiconductor device structure as claimed in claim 14, wherein the cap element has an upper portion and a lower portion, the lower portion is between the upper portion and the source/drain structure, the upper portion of the cap element is made of metal silicide, and the lower portion of the cap element is made of silicon or silicon germanium.

19. The semiconductor device structure as claimed in claim 14, further comprising an isolation feature in the semiconductor substrate, wherein the isolation feature is between the first source/drain structure and the second source/drain structure.

20. The semiconductor device structure as claimed in claim 14, wherein the cap element has side plane, and the side place is wider than the top plane of the cap element.

* * * * *